United States Patent
Wilby

(10) Patent No.: US 9,228,886 B2
(45) Date of Patent: Jan. 5, 2016

(54) SEMICONDUCTOR WAFER WEIGHT METROLOGY APPARATUS

(71) Applicant: METRYX LIMITED, Bristol (GB)

(72) Inventor: Robert John Wilby, Bristol (GB)

(73) Assignee: METRYX LIMITED, Bristol (GB)

( * ) Notice: Subject to any disclaimer, the term of this patent is extended or adjusted under 35 U.S.C. 154(b) by 117 days.

(21) Appl. No.: 13/686,265

(22) Filed: Nov. 27, 2012

(65) Prior Publication Data
US 2013/0118816 A1    May 16, 2013

Related U.S. Application Data

(63) Continuation of application No. 12/680,755, filed as application No. PCT/GB2008/003292 on Sep. 29, 2008, now Pat. No. 8,357,548.

(30) Foreign Application Priority Data

Oct. 4, 2007  (GB) .................................. 0719460.8

(51) Int. Cl.
| | | |
|---|---|---|
| H01L 21/66 | (2006.01) |
| G01G 9/00 | (2006.01) |
| G01G 21/22 | (2006.01) |
| G01G 21/28 | (2006.01) |
| H01L 21/67 | (2006.01) |

(Continued)

(52) U.S. Cl.
CPC .................. *G01G 21/28* (2013.01); *G01G 9/00* (2013.01); *G01G 21/22* (2013.01); *G01G 23/01* (2013.01); *G01G 23/16* (2013.01); *H01L 21/67253* (2013.01); *H01L 22/12* (2013.01)

(58) Field of Classification Search
CPC ......... G01G 21/22; G01G 9/00; G01G 21/28; G01G 23/16; G01G 23/01; H01L 21/67253; H01L 22/12
USPC .......... 177/1, 50, 262; 73/1.13; 702/101, 170, 702/173; 438/14; 118/708, 715
See application file for complete search history.

(56) References Cited

U.S. PATENT DOCUMENTS

| | | | |
|---|---|---|---|
| 4,291,775 A * | 9/1981 | Collins ........................... | 374/14 |
| 4,368,791 A * | 1/1983 | Jackson ........................ | 177/126 |
| 4,401,176 A * | 8/1983 | Knothe et al. ................. | 177/180 |

(Continued)

FOREIGN PATENT DOCUMENTS

| | | |
|---|---|---|
| JP | 05-149780 | 6/1993 |
| JP | 06-050803 | 2/1994 |

(Continued)

OTHER PUBLICATIONS

Office Action for Japanese Application No. 2010-527513, May 28, 2013, Japanese Office Action.

*Primary Examiner* — Randy W Gibson
(74) *Attorney, Agent, or Firm* — Stephen J. Weyer; Stites & Harbison PLLC

(57) ABSTRACT

A semiconductor wafer metrology technique comprising performing atmospheric buoyancy compensated weighing of a wafer, in which the wafer is weighed in a substantially upright condition. A vertical or near vertical wafer orientation causes the surface area in the direction of a force (weight) sensor to be reduced compared with a horizontal wafer orientation. Hence, the electrostatic force components acting in the same direction as the wafer weight force component is reduced.

7 Claims, 2 Drawing Sheets

(51) Int. Cl.
   *G01G 23/01*     (2006.01)
   *G01G 23/16*     (2006.01)

(56) References Cited

U.S. PATENT DOCUMENTS

| | | | |
|---|---|---|---|
| 4,666,005 A * | 5/1987 | Komoto et al. | 177/180 |
| 4,762,190 A * | 8/1988 | Meixner | 177/181 |
| 4,893,686 A * | 1/1990 | Chretien et al. | 177/180 |
| 5,050,694 A * | 9/1991 | Liang | 177/262 |
| 5,307,281 A * | 4/1994 | Wollmann | 705/407 |
| 5,321,634 A * | 6/1994 | Obata et al. | 702/97 |
| 5,625,170 A * | 4/1997 | Poris | 177/50 |
| 6,265,675 B1 * | 7/2001 | Hubler et al. | 177/25.15 |
| 6,268,570 B1 * | 7/2001 | McLendon et al. | 177/1 |
| 6,515,238 B1 * | 2/2003 | Martens et al. | 177/180 |
| 6,965,083 B2 * | 11/2005 | Reiser | 177/238 |
| 7,020,577 B2 * | 3/2006 | Wilby | 702/173 |
| 7,119,288 B2 * | 10/2006 | Zaima et al. | 177/180 |
| 7,271,352 B2 * | 9/2007 | Rabindran | 177/25.15 |
| 7,323,645 B2 * | 1/2008 | Nufer et al. | 177/180 |
| 7,340,372 B2 * | 3/2008 | Wilby | 702/173 |
| 8,357,548 B2 * | 1/2013 | Wilby | 438/14 |
| 8,683,880 B2 * | 4/2014 | Wilby | 73/865 |
| 9,024,213 B2 * | 5/2015 | Izumo et al. | 177/180 |
| 2002/0166704 A1 * | 11/2002 | Miller et al. | 177/145 |
| 2006/0095228 A1 * | 5/2006 | Wilby | 702/170 |
| 2006/0213537 A1 * | 9/2006 | Atalla | 134/18 |
| 2010/0206098 A1 * | 8/2010 | Wilby | 73/865 |
| 2013/0068542 A1 * | 3/2013 | Izumo et al. | 177/25.12 |
| 2013/0292192 A1 * | 11/2013 | Jaia | 177/181 |
| 2014/0138163 A1 * | 5/2014 | Taylor et al. | 177/1 |
| 2014/0231152 A1 * | 8/2014 | Wilby | 177/1 |

FOREIGN PATENT DOCUMENTS

| | | |
|---|---|---|
| JP | 11-121594 | 4/1999 |
| WO | WO-02/03449 | 1/2002 |

\* cited by examiner

SEMICONDUCTOR WAFER WEIGHT METROLOGY APPARATUS

CROSS REFERENCE TO RELATED APPLICATIONS

This application is a divisional of application Ser. No. 12/680,755, filed Jul. 12, 2010, which is the National Stage of International Application No. PCT/GB2008/003292, filed Sep. 29, 2008 (which is hereby incorporated by reference).

TECHNICAL FIELD

This invention relates to semiconductor wafer metrology.

BACKGROUND TO THE INVENTION

Microelectronic devices are fabricated on semiconductor wafers using a variety of techniques, e.g. including deposition techniques (CVD, PECVD, PVD, etc.) and removal techniques (e.g. chemical etching, CMP, etc.). Semiconductor e.g. silicon wafers may be further treated in ways that alter their mass e.g. by cleaning, ion implantation, lithography and the like. These treatment techniques typically cause a change in the mass at or on the surface of the semiconductor wafer. The configuration of the changes to the surface are often vital to the functioning of the device, so it is desirable for quality control purposes to assess wafers during production in order to determine whether they have the correct configuration.

A number of existing measurement techniques are known. For etching treatment, one known technique is to break a treated wafer and perform a detailed analysis of its cross-section. If the analysis shows treatment to have been successful, it is assumed that the batch of wafers manufactured at the same time as the tested (broken) wafer also have the correct configuration. The disadvantage of this process is that the broken wafers cannot be used and are therefore wasted, and that the process is typically interrupted (i.e. fabrication stopped) every time a wafer from a batch is tested. Continuous production is therefore not feasible.

Other known measurement techniques depend on the type of treatment or the properties of materials created by the treatment. For example, treated wafers can be measured using ellipsometry when they contain dielectrics or wafers can be tested using resistivity probes when conductive metals are deposited thereon.

WO 02/03449 discloses an apparatus and method for investigating semiconductor wafers in which changes in the mass of the wafer are determined to assess various properties of the wafer, e.g. enable fabrication of the wafer to be monitored. A common method of obtaining mass measurements is to use a very sensitive force sensor to measure the force (weight) due to gravity. At medium levels of accuracy this force can be assumed to be due solely to the mass of the wafer. However, if higher levels of accuracy are needed, other forces may need to be taken into account.

One such force (disclosed in WO 02/03449) is caused by atmospheric buoyancy. In semiconductor metrology, a semiconductor wafer is usually measured in an atmosphere (i.e. not a vacuum). The wafer therefore displaces a volume of this atmosphere, which causes an up thrust force. The up thrust force depends on the atmospheric (air) density, which in turn depends on numerous factors including temperature, atmospheric pressure, relative humidity and air composition. The up thrust force reduces the apparent weight of the wafer detected by the force sensor.

WO 02/03449 discloses a method of compensating or correcting for the effect of atmospheric buoyancy. Sensors are provided to monitor temperature, pressure and relative humidity. A processor receives measurements from these sensors and uses them to calculate the air density, which can be used to compensate for buoyancy in a corresponding weight measurement. The processor can calculate buoyancy from the calculated air density, together with the weight measurement and density information about the wafer.

SUMMARY OF THE INVENTION

The current invention seeks to build on the measurement technique disclosed in WO 02/03449. The inventor has found that when performing sensitive mass measurements on wafers where atmospheric buoyancy is eliminated or suitably compensated other (typically smaller) errors become noticeable. For example, such errors may be caused by pressure effects due to atmospheric movement (air currents) around the wafer and electrostatic forces due to charges on the wafer or surrounding materials. WO 02/03449 noted that these effects were minor compared with atmospheric buoyancy and proposed to limit their effect by performing the weight measurement in a housing (weighing chamber). The chamber was sized to strike a balance between providing a small space to reduce air current effects and spacing surrounding materials far enough away from the wafer to reduce the effect of electrostatic forces. These are conflicting requirements. The present invention proposes a solution which can enable both effects to be reduced.

Electrostatic attraction forces arise when there is a voltage potential difference between the wafer and surrounding material (e.g. walls of an enclosure). Static electricity charges can be up to several kilovolts in magnitude. On a wafer, charges can exist on its surface or within its body (substrate). In the latter case, the charge may be trapped by an insulating coating layer such as silicon oxide or silicon nitride. Charges can be caused by a variety of means, e.g. earlier processing or fabrication steps, tribology, contact electrification, etc. Ionisation devices have previously been proposed as a way of reducing static electricity. However, they are limited because they can only neutralize surface charges and often have unbalanced positive and negative ion streams, which causes them to leave a residual charge.

At its most general, the present invention proposes performing atmospheric buoyancy compensated weighing of a wafer, wherein the wafer is weighed in a substantially upright condition.

Semiconductor wafers are typically thin disks (e.g. 200 or 300 mm in diameter and 1 mm thick). This means the majority of any electrostatic force acts normal to the plane of the wafer, e.g. the electrostatic force between a chamber wall and a wafer can be compared with the force between plates in a parallel plate capacitor. By changing the orientation of the wafer from horizontal to vertical or near vertical, the surface area in the direction of a force (weight) sensor is reduced. Hence, the electrostatic force components acting in the same direction as the wafer weight force component is reduced.

Conventional semiconductor wafer fabrication, processing and metrological techniques typically transport, handle and process the wafers in a horizontal orientation. Known methods of weighing wafers involve placing the wafer flat onto a weighing stage of an accurate force sensor. Changing the wafer's orientation is an unusual and radical step.

Accordingly, there may be provided a method of measuring the mass of a semiconductor wafer, the method including placing the wafer on a weighing instrument inside a chamber, and determining the mass of the wafer by measuring the weight of the wafer and compensating for buoyancy exerted on the wafer by the atmosphere in the chamber, wherein the plane of the wafer is substantially upright when the weight of the wafer is measured.

Since the electrostatic force is reduced by effectively redirecting its force components (rather than reducing the size of those components), the chamber can form a smaller enclosure for the wafer. The effects of air currents in the chamber may therefore also be reduced.

Moreover, since an upright wafer presents a smaller cross-section to the weighing instrument in the direction of its weight force. This means that the effect on the weight measurement of components of air current in that direction can be reduced, e.g. since the size of the error force may be proportional to the area on the wafer on which the air current acts.

The method may include the methods of reducing the magnitude of the electrostatic force (e.g. using ionizers) mentioned above.

Compensating for atmospheric buoyancy may be achieved in any of the manners disclosed in WO 02/03449. A typical 300 mm wafer weighing about 128 g can experience a buoyancy force equivalent to about 45 mg. The magnitude of this force can vary over a relative short time by 10-20% (i.e. 4-6 mg).

The invention may also provide apparatus for measuring the mass of a semiconductor wafer, the apparatus having: a weighing instrument for measuring the weight of the wafer; a chamber for containing the wafer during measurement; monitoring means arranged to determine the buoyancy exerted on the wafer by the atmosphere in the chamber; and a wafer holder arranged to support the plane of the wafer in a substantially upright orientation when the wafer's weight is measured.

In this context, substantially upright preferably means within 10°, more preferably 5°, from vertical (aligned with the force of gravity). In fact a small non-zero angle to exact vertical may be desirable to improve wafer stability during weight measurement. Accordingly, the wafer holder preferably includes a base for supporting a lower edge of the wafer in the upright orientation, and a upstanding backrest for supporting an upper part of the wafer such that the upright orientation is a small non-zero angle from exact vertical. The base may have a lip to prevent the wafer from slipping.

Preferably, the monitoring means includes a temperature monitor, a pressure monitor and a humidity monitor arranged to determine the temperature, pressure and humidity in the chamber.

The pressure monitor preferably includes a pressure sensor having an accuracy of better than 0.4% over the range 800-1200 mbar absolute. Temperature sensitivity is preferably less than 0.02%/° C. Response time is preferably less than 200 ms. The temperature monitor preferably has a temperature sensor with an accuracy of better than 0.2° C. and a response time of less than 10 seconds. The humidity monitor preferably has a humidity sensor with an accuracy of better than 2% and a response time of less than 1 minute.

Preferably, the weighing instrument has readability of 0.01 mg over a range of 0-80 g. For larger than 200 mm wafers the range may be extended based on the nominal weight of the wafers. The instrument preferably has a repeatability of better than 0.03 mg and a temperature sensitivity drift of less than 1 part in 10.sup.6/° C. The chamber may include a heater, and the interior of the chamber is preferably maintained at a substantially constant temperature, e.g., within +/−0.1° C. If heated, the enclosure is preferably maintained within 5° C. of the ambient temperature.

The chamber may also be associated with wafer conveying means controlled by a computer, the wafer conveying means being arranged to releasably carry a wafer, and being movable from outside the chamber to inside the chamber through an opening to place the wafer on the wafer holder.

Preferably, the wafer conveying means is a robotic arm that is adapted to grip the wafer. Preferably, the arm is rotatable about its axis to rotate the plane of the wafer to the upright orientation before it is placed on the wafer holder.

BRIEF DESCRIPTION OF THE DRAWINGS

Embodiments of the invention are described below with reference to the accompanying drawings, in which.

DETAILED DESCRIPTION; FURTHER OPTIONS AND PREFERENCES

Figure 1:
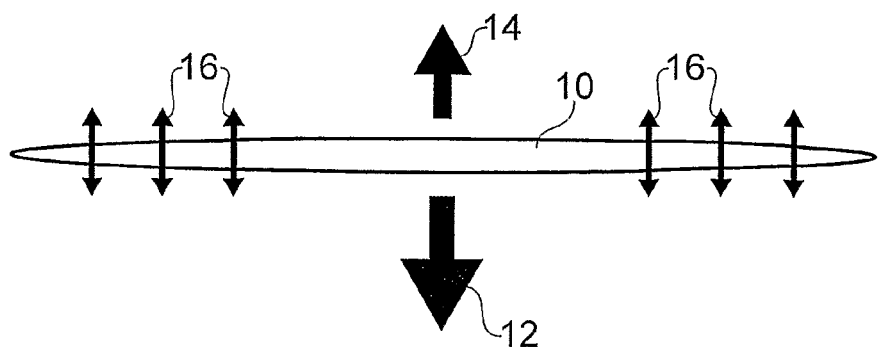
FIG. 1 is a schematic illustration of forces experienced by a horizontal wafer.
Figure 2:
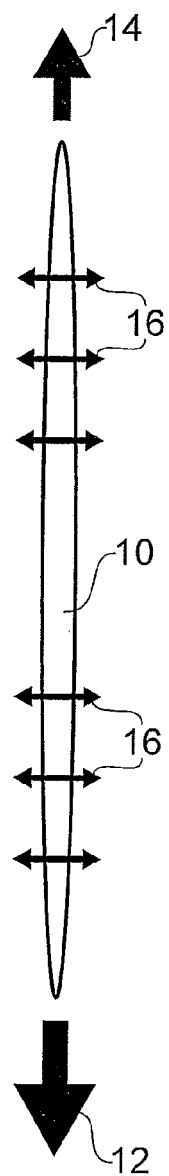
FIG. 2 is a schematic illustration of forces experienced by a vertical wafer.

FIGS. 1 and 2 demonstrate the theory behind the invention. FIG. 1 shows some of the forces experienced by a semiconductor wafer 10 in a non-evacuated chamber (not shown) during weight measurement. The weight force 12 due to gravity is counteracted by an atmospheric buoyancy force 14. This buoyancy force 14 can be detected and compensated for in a weight measurement. However, there are additional (smaller) electrostatic forces 16 which also act substantially parallel to the weight force. When the buoyancy force 14 is compensated for, these electrostatic forces 16 can cause a noticeable error in the weight measurement. The electrostatic forces 16 are caused by interaction between the walls of the chamber and the wafer. The geometry of the wafer means that these forces are predominantly normal to the plane of the wafer 10.

FIG. 2 demonstrates that if the wafer 10 is held in an upright orientation, the electrostatic forces 16 are rotated out of the direction of the weight force 12 and therefore their effect on the weight measurement is reduced. The reduction is effectively achieved by reducing the footprint of the wafer in the vertical (gravity force) direction when weighing.

Figure 3A:
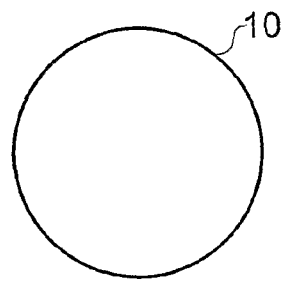
FIGS. 3(a), 3(b) and 3(c) show a schematic plan view of the footprint of a wafer at different orientations.
Figure 3B:
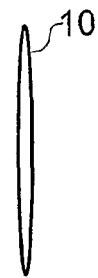
Figure 3C:

The effect of this is illustrated in FIGS. 3(a), 3(b) and 3(c), which show a plan view of a wafer 10 as its plane is rotated to an upright orientation. The vertical footprint of a typical 300 mm diameter wafer in a horizontal condition as shown in FIG. 3(a) is about 706.9 cm². When its plane is about 5° from vertical, as shown in FIG. 3(b) this footprint reduces to about 61.5 cm². The minimum vertical footprint is achieved when the wafer is exactly vertical, as shown in FIG. 3(c). This minimum vertical footprint is about 2.3 cm².

The electrostatic forces between the chamber walls and wafer is analogous to the force experienced by opposite plates in a parallel plate capacitor. In that case, the force F is given by $$F = \frac{\varepsilon \varepsilon_0 V^2 A}{2d^2}$$

where ∈ is the relative permittivity of the material (e.g. dielectric) separating the plates, $∈_0$ is the permittivity of free space, V is the voltage difference between the plates, d is the separation of the plates and A is the area of each plate. Based on this, a 300 mm diameter wafer the electrostatic charge of only 5 V positioned 10 mm away from a grounded surface can experience a force approximately equivalent to 0.1 mg. Rotating the wafer to an upright orientation moves direction of this force vector out of alignment with the weight force vector.

Figure 4:
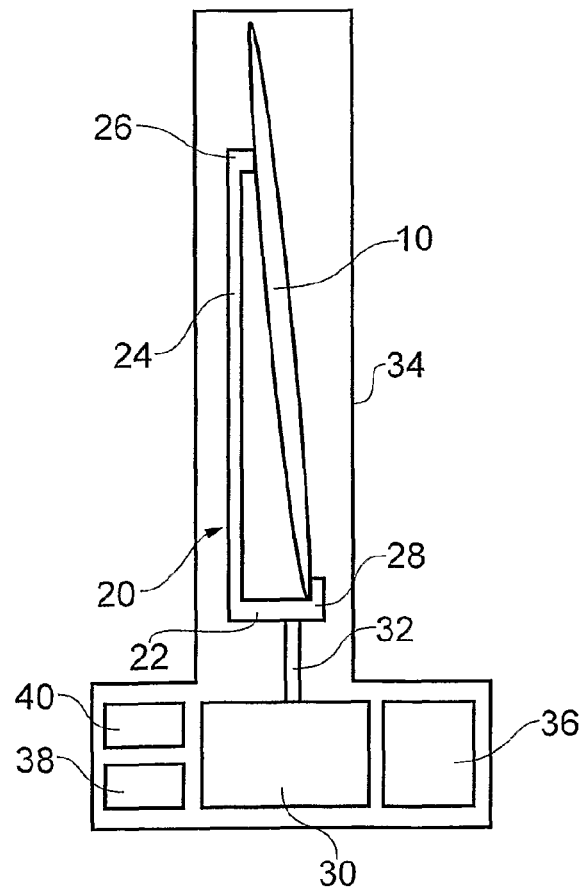
FIG. 4 shows a weighing apparatus that is an embodiment of the invention.

FIG. 4 shows a wafer weighing apparatus that applies the above principles and is an embodiment of the invention. In the apparatus, the wafer 10 is supported on a wafer holder 20, which, as shown in FIG. 4, has an L-shaped cross-section. The wafer holder 20 includes a base (e.g. flat ledge) which receives the lower edge of the wafer 10. An upstanding wall 24 extends upwards from one end of the base 22 and terminates in a support 26. The wafer 10 can lean against the support 26 such that its plane rests at a small angle (e.g. about) 5° to the vertical. A lip 28 is provided at the other end of the base 22 to prevent the wafer 10 from sliding off, i.e. holding it in a stable manner.

The wafer holder 20 is mounted on an upstanding rod 32 connecting to a weighing instrument 30, e.g. a Sartorius BP2IID or other suitable accurate balance.

The wafer holder 20 and weighing instrument are enclosed in a chamber 34. The wafer holder 20 is located in an upper portion of the chamber 34 and the weighing instrument 30 in a lower portion. The two portions may be portioned (with a through hole for the rod 32) in a known manner (e.g. WO 02/03449) to reduce the volume of the wafer holder enclosure and thereby reduce air currents. The chamber 34 contains a temperature sensor 36, a humidity sensor 38 and a pressure sensor 40. The sensors are mounted such that there sensing elements are located in the upper portion of the chamber 34, with the wafer holder 20. The pressure sensor 40 may be a Druck PMP4010AB. The temperature and humidity sensors can be combined, e.g. as a Pico RH02. The measurements taken by these sensors are fed to a processing unit (not shown), e.g. an external PC or internal microprocessor, to allow the air density to be calculated, e.g. using $$\rho_{air} = \frac{0.3485P - 0.00132 \times (0.398T^2 - 0.1036T + 9.5366) \times H}{(273.14 + T) \times 1000}$$

Where $\rho_{air}$ is the density of air in g/cm³, P is the pressure in mBar, T is the temperature in ° C. and H is the relative humidity expressed as a percentage. The air density can be used to calculate the effect of atmospheric buoyancy on the wafer using the equation:

$$B = \frac{W_w \times \left(\frac{\rho_{air}}{\rho_w} - \frac{\rho_{air}}{\rho_c}\right)}{\left(1 - \frac{\rho_{air}}{\rho_w}\right)}$$

where B is the atmospheric buoyancy effect in grams, $W_w$ is the weight of the wafer sensed by the weighing instrument (in grams), $\rho_{air}$ is the calculated air density in g/cm³, $\rho_w$ is the wafer density in g/cm³, and $\rho_c$ is the density (in g/cm³) of a calibration weight used to calibrate the weighing instrument.

Since the wafer 10 is held upright in the chamber 34, the electrostatic forces between the wafer and walls of the chamber do not out substantially in the same direction (vertical) as the weight force. This allows the walls of the upper portion of the chamber 34 to be brought close to the wafer 10, thereby reducing the effect of air currents in the chamber 34 without significantly increasing errors in the weight measurement due to the electrostatic forces.

The chamber 34 includes a door (not shown) in a wall of the upper portion to receive the wafer 10 in its upright position for placing on the holder 20.

Typically, the apparatus will be used within a wafer fabrication process, i.e. the wafer 10 will be transferred from a treatment site to the measuring apparatus and vice versa. Wafers are generally conveyed in a horizontal orientation throughout a fabrication process. Thus, a robot arm (not shown) for transferring the wafer 10 to the measuring apparatus is rotatable about an axis to change the orientation of the plane of a held wafer. For example, the robot arm can be rotatable (twistable) about its axis. Other configurations are possible.

The invention proposes a measuring apparatus for calculating the mass of a semiconductor wafer in which errors caused by atmospheric buoyancy, electrostatic forces and air currents are compensated for or reduced. How well a measuring apparatus deals with errors can be assumed from the repeatability of measurements (i.e. the range of fluctuation in measurements of the same object over time). The present invention may yield a mass repeatability for a 300 mm diameter semiconductor wafer (mass about 128 g) of less than 0.1 mg.

I claim:

1. Apparatus for measuring the mass of a semiconductor wafer, the apparatus having:
    a weighing instrument for measuring the weight of the wafer;
    a chamber for containing the wafer during measurement, said chamber having a sufficient shape to accommodate the wafer while reducing air current effects on the wafer when weighing the wafer;
    monitoring means arranged to determine the buoyancy exerted on the wafer by the atmosphere in the chamber; and
    a wafer holder arranged to support the plane of the wafer in a substantially upright orientation when the wafer's weight is measured.

2. Apparatus according to claim 1, wherein the wafer holder is arranged to support the plane of the wafer within 5° from a vector in the direction of the force of gravity.

3. Apparatus according to claim 1, wherein the wafer holder includes a base for supporting a lower edge of the wafer in the upright orientation and a upstanding backrest for supporting an upper part of the wafer such that the upright orientation is a small non-zero angle from exact vertical.

4. Apparatus according to claim 3, wherein the base has an upstanding lip to prevent the wafer from slipping.

5. Apparatus according to claim 1, wherein the monitoring means includes a temperature monitor, a pressure monitor and a humidity monitor arranged to determine the temperature, pressure and humidity in the chamber.

6. Apparatus according to claim 1 including wafer conveying means controlled by a computer, the wafer conveying means being arranged to releasably carry a wafer, and being movable from outside the chamber to inside the chamber through an opening to place the wafer on the wafer holder.

7. Apparatus according to claim 6, wherein the wafer conveying means includes an arm that is adapted to grip the wafer and rotate about its axis to rotate the plane of the wafer to the upright orientation before it is placed on the wafer holder.

* * * * *